United States Patent [19]

Ametani

[11] Patent Number: 5,310,442
[45] Date of Patent: May 10, 1994

[54] APPARATUS FOR APPLYING AND REMOVING PROTECTIVE ADHESIVE TAPE TO/FROM SEMICONDUCTOR WAFER SURFACES

[75] Inventor: Minoru Ametani, Osaka, Japan

[73] Assignee: Nitto Denko Corporation, Osaka, Japan

[21] Appl. No.: 879,394

[22] Filed: May 7, 1992

[30] Foreign Application Priority Data

May 13, 1991 [JP] Japan .................. 3-138342

[51] Int. Cl.$^5$ .......................... B26D 5/00; B32B 31/18
[52] U.S. Cl. .................................. 156/353; 156/344; 156/584; 156/566; 156/571; 156/522; 156/261; 156/267; 29/25.01
[58] Field of Search ............... 51/281 R; 29/25.01; 156/344, 249, 584, 153, 154, 267, 522, 552, 566, 571, 367, 353, 541, 542, 261, 262

[56] References Cited

U.S. PATENT DOCUMENTS

| 4,481,067 | 11/1984 | Off ......................... 156/541 |
| 4,631,103 | 12/1986 | Ametani ................ 156/344 X |
| 4,775,438 | 10/1988 | Funakoshi ............. 156/344 X |
| 4,865,677 | 9/1989  | Matsushita ................ 156/353 |
| 4,925,515 | 5/1990  | Yoshimura ............ 156/552 X |
| 5,009,735 | 4/1991  | Ametani ................ 156/249 X |
| 5,067,218 | 11/1991 | Williams ................ 29/25.01 |
| 5,106,450 | 4/1992  | Freisitzer ............. 156/541 X |

FOREIGN PATENT DOCUMENTS

| 0253162 | 1/1988  | European Pat. Off. . |
| 0307509 | 3/1989  | European Pat. Off. . |
| 0318806 | 6/1989  | European Pat. Off. . |
| 0174677 | 10/1984 | Japan ..................... 156/344 |
| 0224430 | 10/1986 | Japan ................ 29/25.01 B |
| 0225832 | 10/1986 | Japan ................ 29/25.01 B |
| 0009122 | 1/1988  | Japan ..................... 156/344 |
| 0171238 | 7/1989  | Japan ..................... 156/344 |
| 401294421 | 11/1989 | Japan ................... 156/344 |
| 0085745 | 4/1991  | Japan ..................... 156/344 |
| 2128580 | 5/1984  | United Kingdom ...... 156/344 |
| 2146305 | 4/1985  | United Kingdom ...... 156/344 |
| 2157193 | 10/1985 | United Kingdom ...... 156/344 |
| 2159763 | 12/1985 | United Kingdom ...... 156/344 |

OTHER PUBLICATIONS

Patent Abstracts of Japan, Publication No. 2-091959.
Patent Abstracts of Japan, Publication No. 2-081456.
Patent Abstracts of Japan, Publication No. 60-85536.

*Primary Examiner*—David A. Simmons
*Assistant Examiner*—Charles Rainwater
*Attorney, Agent, or Firm*—Nikaido, Marmelstein, Murray & Oram

[57] ABSTRACT

A single wafer transport mechanism takes a semiconductor wafer out of a cassette loader, and transports the wafer to a single wafer positioning mechanism for placing the wafer in position. When applying a protective adhesive tape to a surface of the wafer, the transport mechanism transports the wafer placed in position to a tape applying mechanism. When removing the protective tape from the wafer surface, the transport mechanism transports the wafer to a tape removing mechanism which removes the protective tape from the wafer surface by using a remover adhesive tape having a strong adhesion. The wafer having the protective tape applied thereto or stripped of the protective tape is transported back to a cassette by the wafer transport mechanism.

8 Claims, 6 Drawing Sheets

APPARATUS FOR APPLYING AND REMOVING PROTECTIVE ADHESIVE TAPE TO/FROM SEMICONDUCTOR WAFER SURFACES

FIELD OF THE INVENTION

The present invention relates to an apparatus for applying a protective adhesive tape to surfaces of semiconductor wafers preparatory to a back grinding treatment in order to protect the wafer surfaces, and removing the protective adhesive tape from the wafer surfaces after the back grinding treatment.

BACKGROUND OF THE INVENTION

In a semiconductor manufacturing process, generally, circuit patterns such as of IC elements are formed on one surface or obverse surface of a wafer first, and then a back grinding step is carried out in which the other, reverse surface of the wafer is ground (i.e. back grinding) to reduce the wafer to a predetermined thickness. Prior to the back grinding step, a protective adhesive tape is applied to the obverse surface of the wafer in order to protect this surface from contamination and damage due to grinding dust and the like.

In a conventional apparatus for applying the protective adhesive tape to the wafer surface, a wafer transport mechanism takes one wafer at a time out of a cassette placed in a predetermined position and delivers the wafer to a positioning mechanism. After the positioning mechanism centers the wafer and sets an orientation flat in position, the wafer transport mechanism transfers the wafer to a tape applying mechanism which applies the protective adhesive tape to the obverse surface of the wafer. Subsequently, the wafer transport mechanism stores the wafer in a predetermined cassette.

After a back grinding treatment, a remover adhesive tape having a stronger adhesion than the protective adhesive tape is applied to the outer surface of the protective adhesive tape adhering to the wafer surface. The remover tape is then pulled up to remove the protective tape from the wafer surface.

In a conventional apparatus for removing the protective adhesive tape from the wafer surface, a wafer transport mechanism takes the wafers having undergone the back grinding treatment, one at a time, out of a cassette placed in a predetermined position and delivers each wafer, after position setting, to a tape removing mechanism for removing the protective adhesive tape from the wafer surface. Then the wafer transport mechanism stores the wafer stripped of the protective adhesive tape in a predetermined cassette.

In conventional practice, as noted above, the process of applying the protective adhesive tape to the wafer surface and the process of removing the protective adhesive tape therefrom are carried out by independent and separate apparatus.

However, a large space is required for installing the two types of apparatus for separately carrying out the protective tape applying process and the protective tape removing process as in the prior art. This gives rise to the problem of high equipment cost as well.

SUMMARY OF THE INVENTION

The present invention has been made on the perception that the above two types of apparatus include mechanisms that perform common functions, and its object is to provide a small and inexpensive apparatus capable of carrying out the protective adhesive tape applying and removing processes.

The above object is fulfilled, according to the present invention, by an apparatus for applying a protective adhesive tape to surfaces of semiconductor wafers preparatory to a back grinding treatment, and for removing the protective adhesive tape from the wafer surfaces after the back grinding treatment, the apparatus comprising:

at least one cassette loading mechanism for storing a cassette containing a plurality of wafers in a plurality of stages;

a single wafer positioning mechanism for positioning the wafers taken out of the cassette;

a tape applying mechanism for applying the protective adhesive tape to a surface of each wafer prior to the back grinding treatment;

a tape removing mechanism for removing the protective adhesive tape from the surface of each wafer by using a remover adhesive tape having a strong adhesion after the back grinding treatment; and a single wafer transport mechanism for transporting the wafers from the cassette to the wafer positioning mechanism, transporting each wafer positioned before the back grinding treatment from the wafer positioning mechanism to the tape applying mechanism, transporting each wafer positioned after the back grinding treatment from the wafer positioning mechanism to the tape removing mechanism, transporting each wafer having the protective adhesive tape applied thereto from the tape applying mechanism to a predetermined cassette, and transporting each wafer stripped of the protective adhesive tape from the tape removing mechanism to a predetermined cassette.

According to the present invention, the cassette loading mechanism, wafer positioning mechanism and wafer transport mechanism are shared by the tape applying mechanism and tape removing mechanism. This realizes a small and inexpensive apparatus capable of carrying out two processes of applying the protective adhesive tape to wafer surfaces and removing the protective tape therefrom.

BRIEF DESCRIPTION OF THE DRAWINGS

For the purpose of illustrating the invention, there are shown in the drawings several forms which are presently preferred, it being understood, however, that the invention is not limited to the precise arrangements and instrumentalities shown.

DETAILED DESCRIPTION OF THE PREFERRED EMBODIMENTS

Preferred embodiments of the present invention will be described in detail hereinafter with reference to the drawings.

FIRST EMBODIMENT

Figure 1:
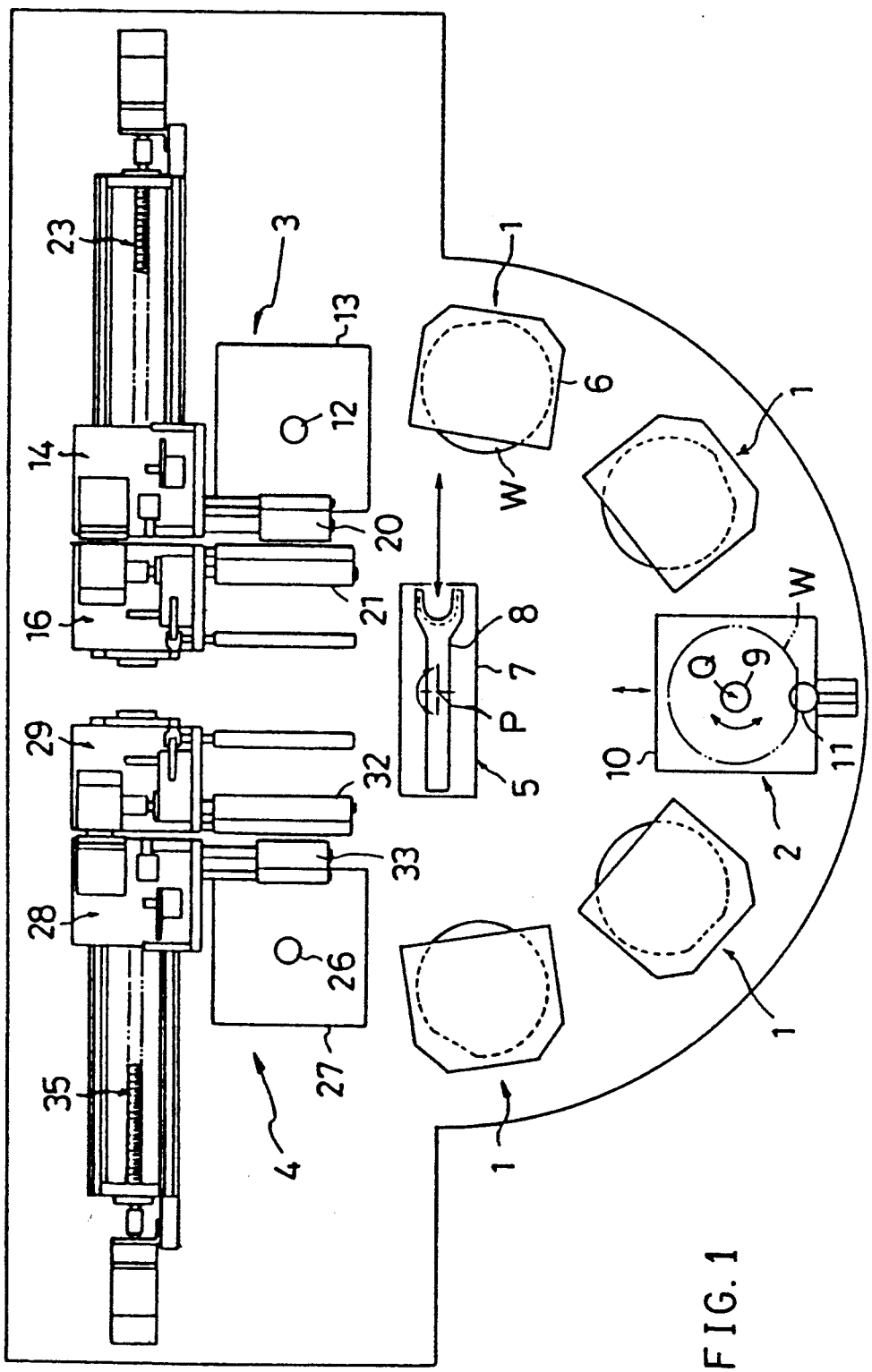
FIG. 1 is a plan view of a first embodiment of the present invention.
Figure 2:
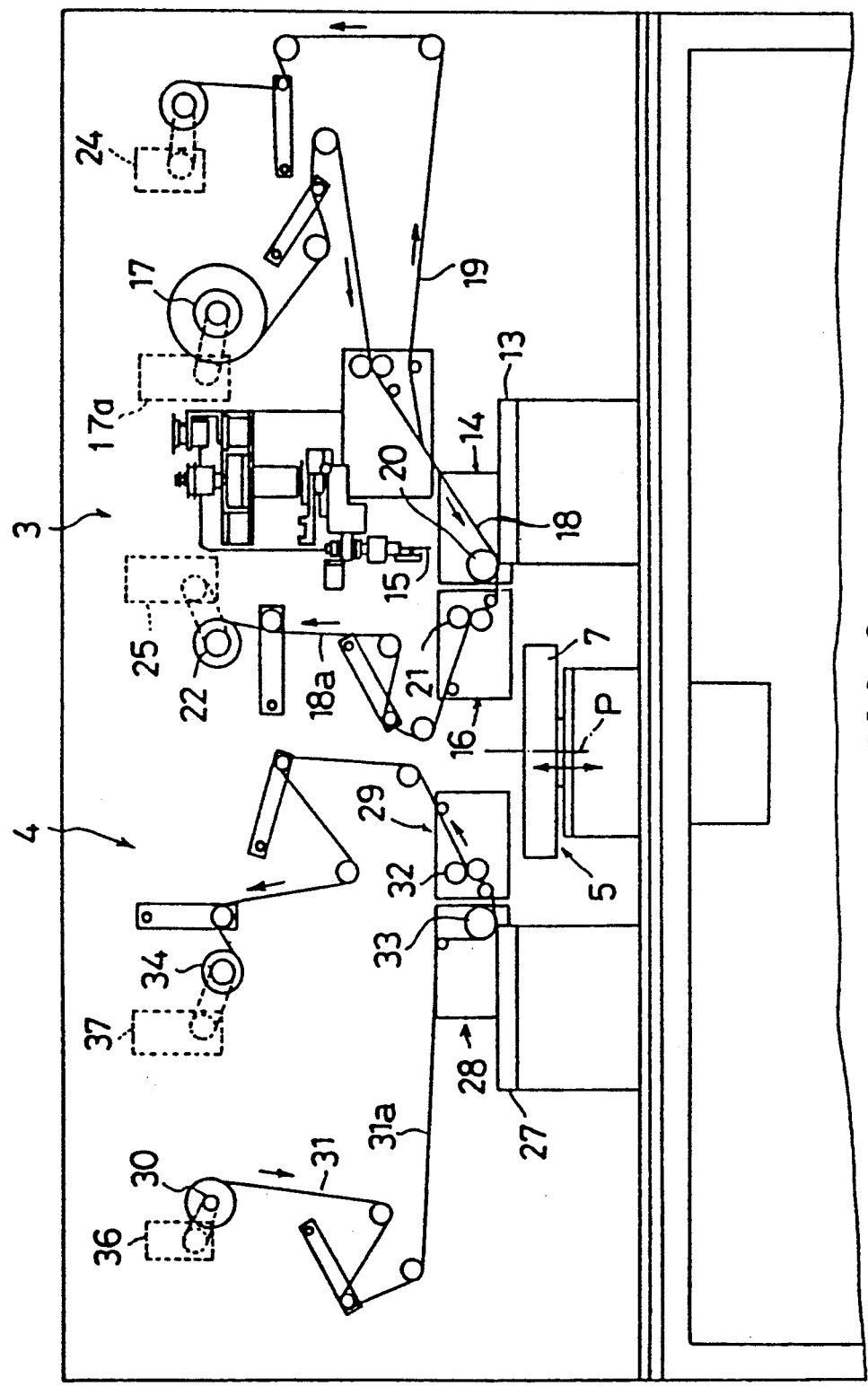
FIG. 2 is a front view of the first embodiment.

FIG. 1 is a plan view of an apparatus in a first embodiment of the present invention for applying and removing a protective adhesive tape to/from a wafer surface. FIG. 2 is a front view of the apparatus.

This apparatus basically includes a plurality of (four in the illustrated embodiment) cassette loading mechanisms 1, a single wafer positioning mechanism 2, a tape applying mechanism 3, a tape removing mechanism 4, and a single wafer transport mechanism 5.

Each of the cassette loading mechanisms 1 contains a cassette 6 storing a plurality of wafers W in a plurality of stages with an wafer inlet/outlet opening directed toward a common center P.

The wafer transport mechanism 5 includes a transport frame 7 rotatable about the center P as well as vertically movable, and a transport arm 8 supported on the frame 7 to be linearly movable forward and backward. The transport arm 8 is capable of suction-supporting a wafer W at an extreme end thereof and moving the wafer W into and out of a selected stage in the cassette 6.

The wafer positioning mechanism 2 includes a support table 10 with a chuck 9 mounted centrally on an upper surface thereof. The chuck 9 is rotatable about an axis Q and movable horizontally. The support table 10 carries a CCD camera 11 fixed thereto for detecting position of a peripheral edge of the wafer W. When the wafer W is placed on the chuck 9 by the wafer transport mechanism 5, the CCD camera 11 detects the peripheral edge of the wafer W while the chuck 9 is rotated. If the wafer W is displaced from the center or a phase shift of an orientation flat is found, the chuck 9 is moved horizontally to center the wafer W or place the orientation flat in position.

The wafer W properly positioned is supported again by the transport arm 8 of the wafer transport mechanism 5 and delivered to the tape applying mechanism 3 or the tape removing mechanism 4.

The tape applying mechanism 3 includes a support table 13 with a chuck 12 disposed centrally thereof, a tape applying unit 14, a tape cutter 15 and an excess tape removing unit 16. A tape reel 17 supplies a protective adhesive tape 18 of low adhesive strength and having a width greater than a diameter of the wafer W. After a separator 19 is removed, the tape 18 is led to an application roller 20 of the tape applying unit 14, and further to an excess tape takeup reel 22 under guiding action of a group of rollers 21 of the excess tape removing unit 16. The two units 14 and 16 are movable rightward and leftward in the drawings independently of each other by a two, upper and lower, stage screw feed mechanism 23.

A process of applying the protective adhesive tape 18 will be described next with reference to FIGS. 3 and 4.

Figure 3:
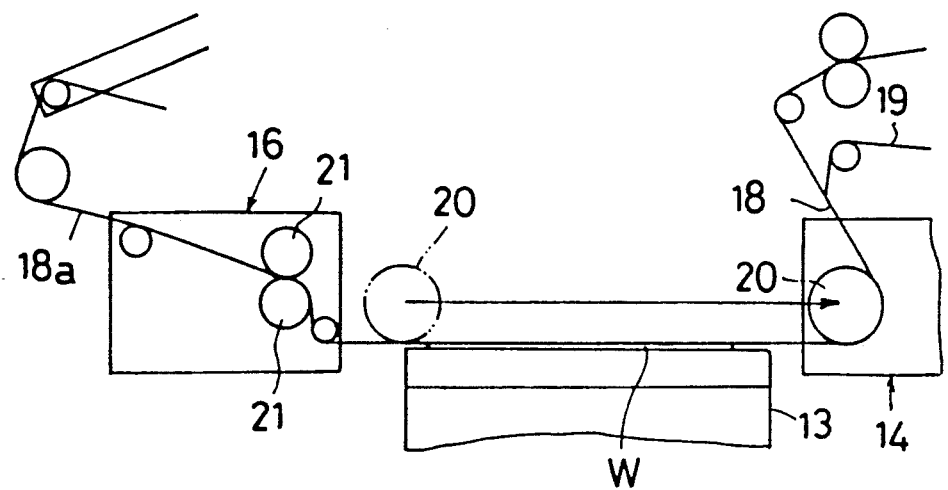
FIG. 3 is a front view of a principal portion of the first embodiment showing a protective adhesive tape applying process.
Figure 4:
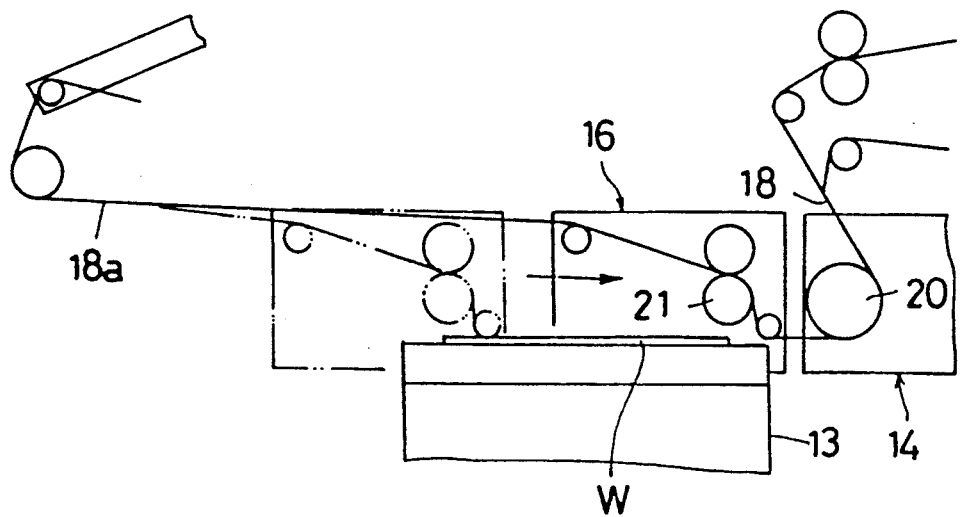
FIG. 4 is a front view of the principal portion showing an excess tape cutting process.

When, in an initial state as shown in FIG. 2, the wafer W is placed in position on the support table 13, the tape applying unit 14 is first moved rightward to apply the protective adhesive tape 18 to a surface of the wafer W as shown in FIG. 3. Next, the tape cutter 15 is lowered to cut the protective tape 18 along the peripheral edge of the wafer W. After the cutter 15 is retracted upward, the excess tape removing unit 16 is moved rightward as shown in FIG. 4, to peel off tape portions lying outside the wafer W. Subsequently, the two units 14 and 16 are moved leftward together to return to the initial state. During the above steps, an excess tape portion 18a is taken up by action of a takeup motor 25, and the separator 19 by action of a takeup motor 24. A motor 17a is connected to the tape reel 17 for winding the protective adhesive tape 18 a predetermined distance backward after the excessive tape 18a is taken up.

The tape removing mechanism 4 includes a support table 27 with a chuck 26 disposed centrally thereof, a tape applying unit 28 and a tape removing unit 29. A tape reel 30 supplies highly adhesive remover tape 31 having a width smaller than the wafer diameter. The remover tape 31 is led to a takeup reel 34 by way of an application roller 33 of the tape applying unit 28 and a group of rollers 32 of the tape removing unit 29. The two units 28 and 29 are movable rightward and leftward independently of each other by a two, upper and lower, stage screw feed mechanism 35.

A process of removing the protective adhesive tape from the wafer surface will be described next with reference to FIGS. 5 and 6.

Figure 5:
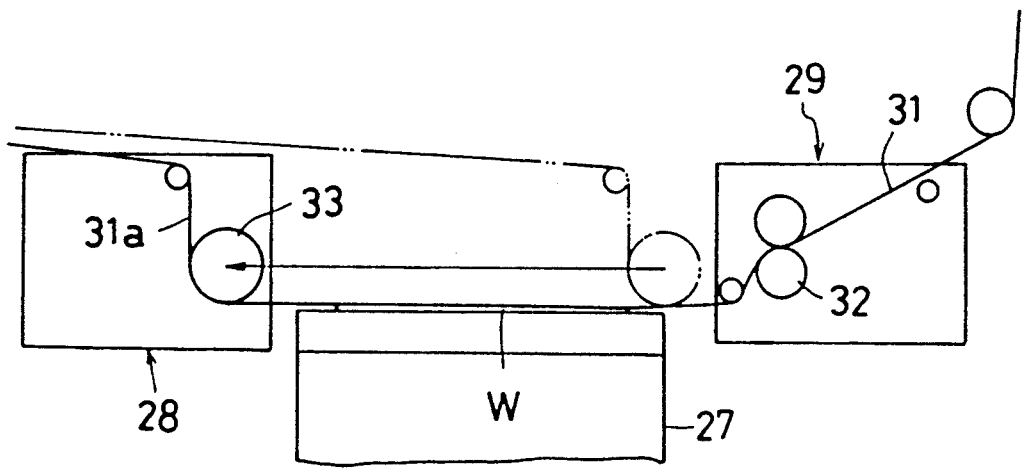
FIG. 5 is a front view of a further principal portion showing a remover adhesive tape applying process.
Figure 6:
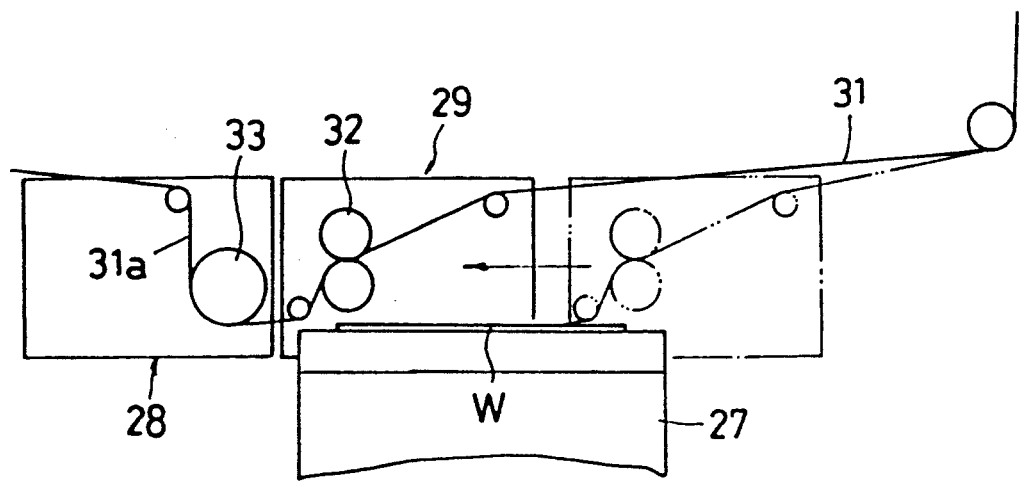
FIG. 6 is a front view of the further principal portion showing a protective adhesive tape removing process.

When, in an initial state as shown in FIG. 2, a wafer W having undergone a back grinding treatment is placed on the support table 27, the tape applying unit 28 is first moved leftward to apply the remover adhesive tape 31 to the protective adhesive tape on the wafer surface as shown in FIG. 5. Next, the tape removing unit 29 is moved also leftward to pull up the remover tape 31, whereby the protective tape 18 firmly adhering to the remover tape 31 is separated from the surface of the wafer W. During the above steps, a feed motor 36 and a takeup motor 37 are operated as appropriate, to feed out the remover tape 31 and to takeup a remover tape portion 31a bonded to the protective tape 18.

The wafer to which the protective adhesive tape has been applied by the tape applying mechanism 3, and the wafer from which the protective adhesive tape has been removed by the tape removing mechanism 4, are again supported and transported by the wafer transport mechanism 5 and stored in predetermined cassettes 6.

Figure 8:
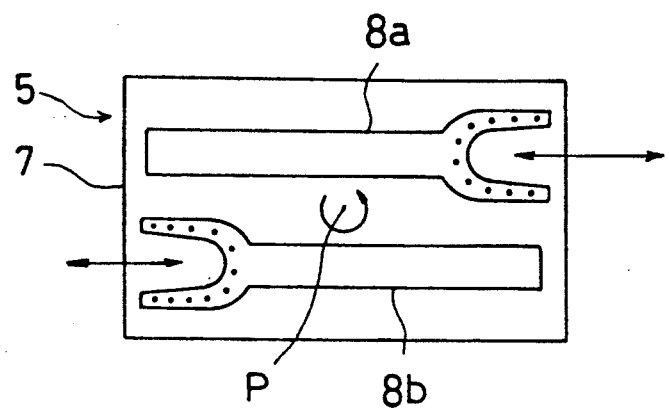
FIG. 8 is a plan view of a modified wafer transport mechanism for use in the first embodiment.

In the foregoing embodiment, the wafer transport mechanism 5 has one transport arm 8. Instead, as shown in FIG. 8, the wafer transport mechanism 5 may have two transport arms 8a and 8b arranged in juxtaposition and driven independently of each other. Alternatively, the two transport arms may be arranged one over the other. With the two transport arms, the first transport arm 8a may hold a wafer before the treatment, while the second transport arm 8b is used to take out a treated wafer. Thereafter the first transport arm 8a may transport the untreated wafer to the tape applying mechanism 3 or the tape removing mechanism 4. In this way, use of the two transport arms will promote processing efficiency.

SECOND EMBODIMENT

Figure 7:
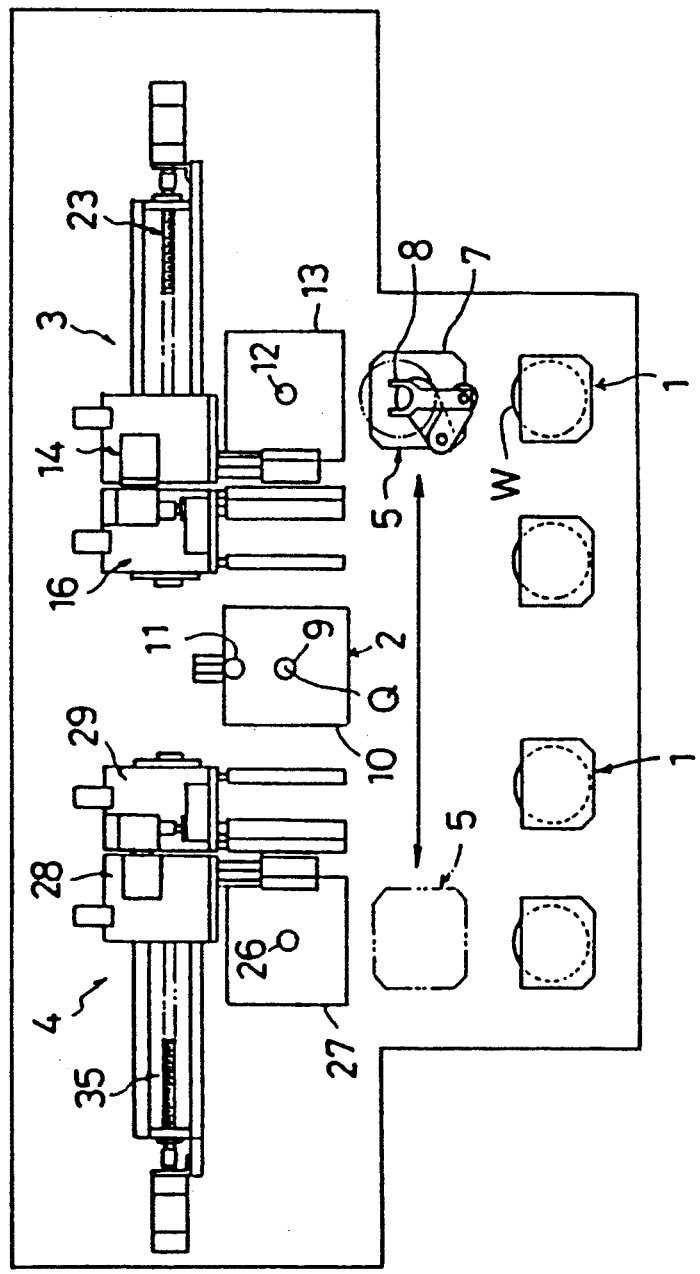
FIG. 7 is a plan view of a second embodiment.

FIG. 7 is a plan view of a second embodiment of the present invention.

This apparatus basically includes a plurality of vertically movable cassette loading mechanisms 1 arranged in a row in a front region of the apparatus, a single wafer transport mechanism 5 movable rightward and leftward in FIG. 7 and having a swivelable and flexible transport arm 8, and a single wafer positioning mechanism 2 disposed between a tape applying mechanism 3 and a tape removing mechanism 4. This apparatus functions in the same way as the preceding embodiment. That is, the transport arm 8 moves horizontally to transport a wafer W from one of the cassette loading mechanisms 1 to the wafer W positioning mechanism 2 for setting the wafer W in position. Then the transport arm 8 transports the wafer set in position to the tape applying mechanism 3 for application thereto of a protective adhesive tape, or to the tape removing mechanism 4 for removal therefrom of the protective adhesive tape.

Figure 9:
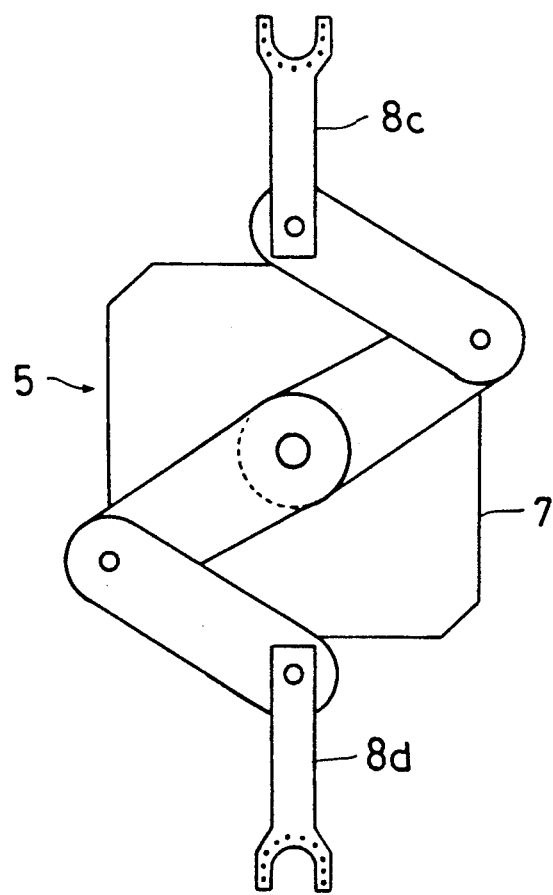
FIG. 9 is a plan view of a modified wafer transport mechanism for use in the second embodiment.

In this embodiment also, the wafer transport mechanism 5 may include two transport arms 8c and 8d arranged vertically as shown in FIG. 9. These arms 8c and 8d are selectively driven by respective rotary shafts to promote processing efficiency. It is of course possible to provide three transport arms arranged vertically and driven independently of one another.

The present invention may be embodied in other specific forms without departing from the spirit or essential attributes thereof and, accordingly, reference should be made to the appended claims, rather than to the foregoing specification, as indicating the scope of the invention.

What is claimed is:

1. An apparatus for applying protective adhesive tape to surfaces of semiconductor wafers preparatory to a back grinding treatment, and for removing the protective adhesive tape from the wafer surfaces after the back grinding treatment, said apparatus comprising:
   a single wafer transport mechanism disposed centrally of the apparatus;
   at least one cassette loading mechanism, disposed in a front position of the apparatus relative to said single wafer transport mechanism, for storing a cassette containing a plurality of wafers in a plurality of stages;
   a single wafer position mechanism for positioning the wafers taken out of said cassette;
   a tape applying mechanism, disposed in a rearward position of the apparatus relative to said single wafer transport mechanism, for applying said protective adhesive tape to a surface of each wafer prior to said back grinding treatment; and
   a tape removing mechanism, disposed in a rearward position of the apparatus relative to said single wafer transport mechanism and juxtaposed with said tape applying mechanism, for removing said protective adhesive tape from said surface of each wafer by using a remover adhesive tape having a strong adhesion after said back grinding treatment
   wherein said single wafer transport mechanism is operable for transporting the wafers from said cassette to said wafer positioning mechanism, transporting each wafer positioned before said back grinding treatment from said wafer positioning mechanism to said tape applying mechanism, transporting each wafer positioned after said back grinding treatment from said wafer positioning mechanism to said tape removing mechanism, transporting each wafer having said protective adhesive tape applied thereto from said tape applying mechanism to a predetermined cassette, and transporting each wafer stripped of said protective adhesive tape from said tape removing mechanism to a predetermined cassette.

2. An apparatus as defined in claim 1, comprising a plurality of cassette loading mechanisms arranged such that respective cassettes stored therein have wafer inlet/outlet openings directed toward a common center, said wafer transport mechanism including a transport frame rotatable about said center and vertically movable, and transport arm means supported on said frame to be linearly movable forward and backward for suction-supporting each wafer at an extreme end thereof and moving each wafer into and out of a selected stage in the respective cassettes.

3. An apparatus as defined in claim 2, wherein said wafer transport mechanism includes a plurality of transport arms drivable independently of each other.

4. An apparatus as defined in claim 1, comprising a plurality of vertically movable cassette loading mechanisms arranged such that respective cassettes stored therein have wafer inlet/outlet openings arranged in a row, said wafer transport mechanism including swivelable and flexible transport arm means supported on said frame to be linearly movable forward and backward for suction-supporting each wafer at an extreme end thereof and moving each wafer into and out of a selected stage in the respective cassettes.

5. An apparatus as defined in claim 4, wherein said wafer transport mechanism includes a plurality of transport arms drivable independently of each other.

6. An apparatus as defined in claim 1, wherein said wafer positioning mechanism includes a support table, a chuck mounted to rotatable and horizontally movable on said support table for suction-supporting each wafer, and a CCD camera for detecting a peripheral edge of each wafer, said CCD camera detecting said peripheral edge of each wafer swiveled by said chuck, thereby detecting a displacement from a center thereof and a phase shift of an orientation flat, said chuck being moved horizontally in accordance with amounts of the displacement and phase shift to center the wafer and place the orientation flat in position.

7. An apparatus as defined in claim 1, wherein said tape applying mechanism includes a support table for suction-supporting each wafer, a tape applying unit for applying said protective adhesive tape to the surface of each wafer, said protective adhesive tape having a width greater than a diameter of each wafer, a tape cutter for cutting said protective adhesive tape applied to the surface of each wafer along a peripheral edge of the wafer, and an excess tape removing unit for peeling off portions lying outside the wafer of said protective adhesive tape after being cut.

8. An apparatus as defined in claim 1, wherein said tape removing mechanism includes a support table for suction-supporting each wafer, a tape applying unit for applying said remover adhesive tape to said protective adhesive tape on the surface of each wafer, and a tape removing unit for pulling up said remover adhesive tape to separate said protective adhesive tape from the surface of the wafer.

* * * * *